United States Patent
Endo et al.

(10) Patent No.: US 7,198,814 B2
(45) Date of Patent: *Apr. 3, 2007

(54) COMPOSITIONS, METHODS FOR PRODUCING FILMS, FUNCTIONAL ELEMENTS, METHODS FOR PRODUCING FUNCTIONAL ELEMENTS, METHOD FOR PRODUCING ELECTRO-OPTICAL DEVICES AND METHODS FOR PRODUCING ELECTRONIC APPARATUS

(75) Inventors: Ayae Endo, Suwa-gun (JP); Shunichi Seki, Suwa-gun (JP); Katsuyuki Morii, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/830,069

(22) Filed: Apr. 23, 2004

(65) Prior Publication Data

US 2004/0195551 A1    Oct. 7, 2004

Related U.S. Application Data

(62) Division of application No. 10/095,048, filed on Mar. 12, 2002, now Pat. No. 6,787,063.

(30) Foreign Application Priority Data

Mar. 12, 2001    (JP)    ............................. 2001-069337

(51) Int. Cl.
*B05D 5/12*    (2006.01)

(52) U.S. Cl. ..................................... 427/66; 427/372.2
(58) Field of Classification Search ................ 427/256, 427/350, 372.2

See application file for complete search history.

(56) References Cited

U.S. PATENT DOCUMENTS 3,784,376 A * 1/1974 Fox .............................. 430/78

(Continued)

FOREIGN PATENT DOCUMENTS

EP         892028       *  1/1999

(Continued)

OTHER PUBLICATIONS

Shimoda et al, Int. Electron Devices Meeting, pp. 107-110, 1999.*

Primary Examiner—Erma Cameron
(74) Attorney, Agent, or Firm—Oliff & Berridge, PLC

(57) ABSTRACT

In accordance with the invention, a composition including a solvent and a functional material is prepared. The solvent includes at least one heterocyclic compound having one or more substituents and containing an oxygen atom as a constituent atom. The functional material is selected from a group including organic EL materials, conductive materials, insulative materials and semiconductive materials. Functional films and functional elements are prepared by using the composition.

9 Claims, 9 Drawing Sheets

U.S. PATENT DOCUMENTS

| | | | | |
|---|---|---|---|---|
| 4,155,767 | A * | 5/1979 | Specht et al. | 106/31.06 |
| 5,122,490 | A | 6/1992 | Uwai et al. | 502/113 |
| 5,401,615 | A | 3/1995 | Pai et al. | 430/58.8 |
| 5,567,502 | A | 10/1996 | Miyabara et al. | 428/141 |
| 5,691,103 | A | 11/1997 | Takeyama et al. | 430/200 |
| 5,693,831 | A | 12/1997 | Muller et al. | |
| 6,113,678 | A * | 9/2000 | Malhotra | 106/31.29 |
| 6,127,039 | A | 10/2000 | Saitoh et al. | 428/425.9 |
| 6,372,154 | B1 * | 4/2002 | Li | 252/301.16 |
| 6,825,061 | B2 * | 11/2004 | Hokari et al. | 438/99 |
| 6,878,312 | B1 * | 4/2005 | Kanbe et al. | 252/583 |

FOREIGN PATENT DOCUMENTS

| | | | |
|---|---|---|---|
| GB | 2171704 | * | 9/1986 |
| JP | 62-011720 | | 1/1987 |
| JP | A-3-157383 | | 7/1991 |
| JP | A-04-344651 | | 12/1992 |
| JP | 05-109485 | * | 4/1993 |
| JP | A-7-235378 | | 9/1995 |
| JP | A-9-241250 | | 9/1997 |
| JP | A-9-329706 | | 12/1997 |
| JP | A-10-12377 | | 1/1998 |
| JP | 10-148959 | | 6/1998 |
| JP | A-10-153967 | | 6/1998 |
| JP | A-11-40358 | | 2/1999 |
| JP | A-11-54270 | | 2/1999 |
| JP | A-11-202114 | | 7/1999 |
| JP | A-2000-086906 | | 3/2000 |
| JP | A-2001-002747 | | 1/2001 |
| JP | 2004-179144 | * | 6/2004 |

* cited by examiner

FIG. 12
(a)
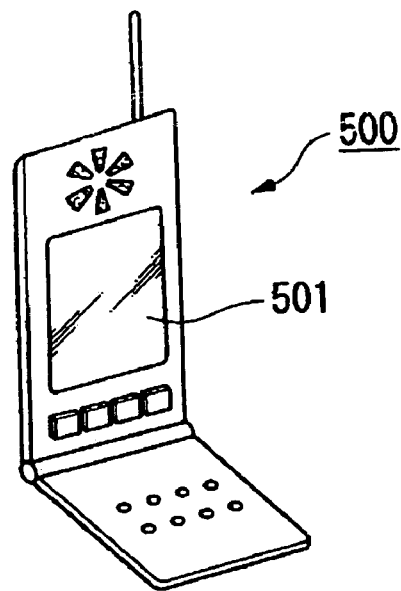
(b)
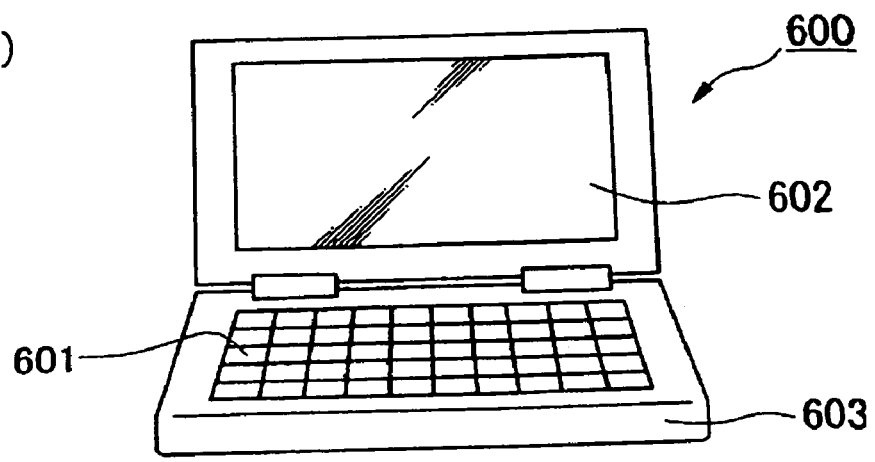
(c)
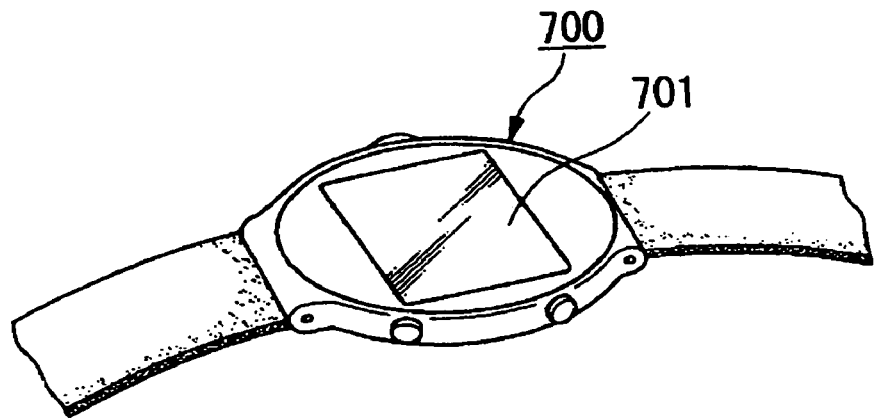

COMPOSITIONS, METHODS FOR PRODUCING FILMS, FUNCTIONAL ELEMENTS, METHODS FOR PRODUCING FUNCTIONAL ELEMENTS, METHOD FOR PRODUCING ELECTRO-OPTICAL DEVICES AND METHODS FOR PRODUCING ELECTRONIC APPARATUS

This is a Division of Application No. 10/095,048 filed March 12, 2002, now U.S. Pat. No. 6,787,063 issued Sep. 7, 2004. The entire disclosure of the prior application is hereby incorporated by reference herein in its entirety.

BACKGROUND OF THE INVENTION

1. Field of Invention

The present invention relates to a composition (a discharge composition) that can be used for the formation of thin films of functional materials, especially for the formation of patterned films of functional materials using discharge devices, and that can stably be discharged. The invention also relates to a method for producing a uniform film (a functional film) using the composition, to a functional element, to a method for producing the functional element, to a method for producing an electro-optical device and to a method for producing electronic apparatus.

2. Description of Related Art

Thin films can be produced from liquid phases by a wide variety of processes, such as by a spin coating process, a sol-gel process and a blade process. According to these processes, a composition containing a material, as a solute that is dissolved or dispersed in a solvent, is applied to a substrate, and the solvent is removed, for example, by heating, to thereby yield a functional thin film.

Such functional materials have conventionally been patterned by a photolithography process in many cases. However, the photolithography process is subject to disadvantages, such as high cost, complicated steps and large amounts of materials consumed. Accordingly, fine patterning techniques of functional materials using discharge devices, especially using ink-jet printing devices, have been examined, since such discharge devices entail low costs and simple steps. Examples of products of fine patterning of functional materials using ink-jet printing devices include: color filters (Japanese Unexamined Patent Application Publications No. 9-329706 and No. 11-202114) and organic EL display devices (Japanese Unexamined Patent Application Publications No. 7-235378, No. 10-12377 and No. 10-153967). As such discharge compositions, a composition for organic EL elements for easily patterning a thin film in a short time with high precision and for easily optimizing a film design and light-emitting characteristics is disclosed in Japanese Unexamined Patent Application Publication No. 11-40358, and a discharge composition for easy and precise patterning in a short time without curving of the discharged composition or clogging is disclosed in Japanese Unexamined Patent Application Publication No. 11-54270.

SUMMARY OF THE INVENTION

The present invention provides a composition including a solvent and a functional material. The solvent includes at least one heterocyclic compound having one or more substituents and containing an oxygen atom as a constituent atom. The functional material is selected from the group including organic EL materials, conductive materials, insulative materials and semiconductive materials.

The present invention also provides a method for producing a film. This method includes the step of applying the composition as a pattern to thereby form a thin film.

The present invention also provides a method for producing a functional element. This method includes the step of forming the functional thin film.

The present invention further provides a functional element that is made from the composition.

The present invention provides a method for producing an electro-optical device. This method includes the step of forming a functional thin film according to the aforementioned method.

In addition, the present invention provides a method for producing electronic apparatus. This method includes the step of forming a functional thin film according to the aforementioned method.

The patterning process using discharge devices, especially using ink-jet printing devices, does not require any plate making, can save resources, can save labor and has very satisfactory characteristics, but is subject to the disadvantage that materials for use in discharge compositions are limited, as mentioned below.

First, some of nonpolar or less polar functional materials or polymeric materials are insoluble or slightly soluble in solvents, such as water or alcohols, used in the ink-jet process, and solvents, such as water or alcohols, cannot be used in functional materials that are reactive with, or decomposed by, these solvents.

Second, when a material having low solubility in the solvent is used, a solution having an optimal concentration for film formation induces an ingredient to be precipitated after the preparation of the composition or causes clogging upon discharge. In contrast, when a solution having a low concentration is used to avoid clogging upon discharge, the number of discharge procedures of the composition must be increased to thereby increase the number of steps in order to prepare a functional film having a sufficient film thickness so as to exhibit the characteristics of the functional material.

Third, when an organic solvent having a high vapor pressure is used as the solvent in the functional material, evaporation of the solvent deprives the discharge composition of vaporization heat to thereby accelerate deposition of the functional material upon discharge or during film formation after discharge. Thus, the solvent is evaporable, and thereby induces deposition and clogging of the functional material. When the functional material is a multicomponent system, the resulting film induces phase separation, becomes heterogeneous and thereby loses its functions as the functional film.

Fourth, the resulting thin film formed by the ink-jet process may exhibit an irregular film thickness, such as a thin center and thick periphery, during drying procedure after application of the composition, and the film thickness cannot significantly be controlled.

Accordingly, the present invention provides a composition that can use nonpolar or less polar functional materials, functional materials reactive with solvents, such as water or alcohols, or polymeric materials in the formation of thin films of such functional materials, especially in the formation of patterned films of the functional materials using discharge devices. The present invention also provides a composition that can stably be discharged without clogging upon discharge or curving of the discharged composition in the application of the composition by the ink-jet process. The present invention also provides a method for producing a film, which method can produce a uniform and homogenous thin film using the composition, a functional element, especially an organic EL element, and a method for producing the same, as well as to provide methods for producing an electro-optical device and electronic apparatus that each have the functional element, and specifically to provide an organic EL display device having the functional element.

The composition (especially a liquid composition) in accordance with an embodiment of the present invention includes a solvent and a functional material. The solvent includes at least one heterocyclic compound having one or more substituents and containing an oxygen atom as a constituent atom, and the functional material is selected from the group including organic EL materials, conductive materials, insulative materials and semiconductive materials.

The composition has the following advantages. Specifically, functional materials for use in the composition are not specifically limited, and nonpolar or less polar materials or reactive materials that are susceptible to reactions with water can be used without deteriorating their functions. In addition, the resulting composition can prevent or reduce, due to high solubility of constitutive materials, deposition of ingredients after the preparation of the composition or clogging upon discharge in the ink-jet process.

The heterocyclic compound in the composition preferably has a furan skeleton. By this configuration, the resulting composition can prevent or reduce, due to high solubility of constitutive materials, deposition of ingredients after the preparation of the composition or clogging upon discharge and can stably be discharged in the ink-jet process.

The heterocyclic compound in the composition preferably has a boiling point of equal to or more than 170° C. By this configuration, the resulting composition can prevent or reduce deposition of the solute after the preparation of the composition or clogging upon discharge due to evaporation of the solvent and can stably be discharged.

The heterocyclic compound in the composition is preferably 2,3-dihydrobenzofuran. This configuration has an advantage in that functional materials for use in the composition are not specifically limited, and that nonpolar or less polar materials or reactive materials that are susceptible to reactions with water can be used without deteriorating their functions. In addition, the resulting composition can prevent or reduce, due to high solubility of constitutive materials, deposition of ingredients after the preparation of the composition or clogging upon discharge and can stably be discharged in the ink-jet process.

In the composition, the solvent that includes at least the oxygen heterocyclic compound preferably further includes another organic solvent. By this configuration, the resulting composition can prevent or reduce deposition of ingredients after the preparation of the composition or clogging upon discharge due to evaporation of the solvent and can stably be discharged. This composition also has an advantage in that the composition can have a controlled viscosity appropriate for the application, and the target functional film can easily be designed.

The composition that includes the other solvent preferably includes a benzene derivative as the other solvent. By this configuration, the resulting composition can prevent or reduce deposition of ingredients after the preparation of the composition or clogging upon discharge due to evaporation of the solvent and can stably be discharged. This composition also has an advantage in that the composition can have a controlled viscosity appropriate for the application, and the target functional film can easily be designed.

The method for producing a film in accordance with another embodiment of the present invention includes the step of applying the composition as a pattern to thereby form a thin film. This production method can prevent or reduce irregular film thicknesses during drying procedure after the application of the composition and phase separation of ingredients, and can yield uniform and homogeneous functional films.

In the method for producing a film, the composition is preferably applied with a discharge device. This configuration can easily yield finely patterned functional films at low costs.

The discharge device in the production method just mentioned above is preferably an ink-jet device. This configuration can easily yield finely patterned functional films at low costs without plate making.

In the method for producing a film, it is preferred that the composition is applied onto a substrate, and the substrate carrying the composition is subjected to heat treatment and/or pressurization or pressure reduction. This configuration can prevent or reduce irregular film thickness and phase separation of ingredients, and can yield uniform and homogeneous functional films.

The method for producing a functional element in accordance with yet another embodiment of the present invention includes the step of forming the functional thin film.

In the method for producing a functional element, a film that includes an organic EL material is preferably formed as the functional thin film.

The functional element in accordance with another embodiment of the present invention is made from the composition.

The functional element is preferably an organic EL element.

The method for producing an electro-optical device in accordance with yet another embodiment of the present invention includes the step of forming the functional thin film. Such an electro-optical device is specifically preferably an organic EL display device.

In addition, the method for producing electronic apparatus in accordance with a further embodiment according to the present invention includes the step of forming the functional thin film.

The composition provided by the present invention is a composition for use in the formation of patterned films of functional materials and includes a solvent and a functional material. The solvent includes at least one heterocyclic compound having one or more substituents and containing an oxygen atom as a constituent atom, and the functional material is selected from the group including conductive materials, insulative materials and semiconductive materials.

Functional materials for use in the composition are not specifically limited, and nonpolar or less polar materials or reactive materials that are susceptible to reactions with water can be used. Such functional materials include materials corresponding to the use of the composition of the present invention, such as organic EL (electroluminescence) materials and other light-emitting materials, organometallic compounds and other conductive materials, dielectric or semiconductive materials. Among these materials, organic EL materials are preferred.

The composition provided by the present invention is used for the formation of thin films of functional materials, especially for the formation of patterned films of such functional materials using discharge devices.

Solvents that each include at least one heterocyclic compound having one or more substituents and including an oxygen atom as a constituent atom are preferably used as the solvent for use in such a composition that includes the material as a solute and is stable after preparation of the composition and during application procedure of the composition. More preferably, the heterocyclic compound has a furan skeleton.

Such heterocyclic compounds may be either monocyclic heterocyclic compounds or condensed heterocyclic compounds. They may be heterocyclic compounds that each include a hetero atom, such as oxygen atom, nitrogen atom or a sulfur atom, and having two or more carbon atoms.

The substituents are not specifically limited and include, for example, straight- or branched-chain aliphatic hydrocarbon groups, alicyclic hydrocarbon groups and aromatic hydrocarbon groups.

Examples of such heterocyclic compounds are tetrahydrofuran, furan,oxazole, isoxazole, furazan, benzofuran, 2,3-dihydrobenzofuran, 1,2-benzisoxazole and 2-methylbenzoxazole.

The solvent may be a single solvent including one of the heterocyclic compounds, or a mixed solvent including two types or more of the heterocyclic compounds. Alternatively, the solvent may be a mixture including the heterocyclic compound and another solvent other than the heterocyclic compound. Benzene derivatives are preferred as the solvent other than the heterocyclic compound. Examples of such benzene derivatives are cymene, tetralin, cumene, decalin, durene, cyclohexylbenzene, dihexylbenzenes, tetramethylbenzenes and dibutylbenzenes. By using these solvents, the composition can have a controlled viscosity that is appropriate for the application, and the target functional film can easily be designed.

The aforementioned composition includes highly soluble materials, and can therefore prevent or reduce deposition of ingredients after the preparation of the composition. A solvent for use in the formation of a patterned film of a functional material using the ink-jet process preferably has high solvency for the functional material, and has a high boiling point and/or a low vapor pressure to prevent clogging upon discharge or curving of the discharged composition due to evaporation of the solvent or deposition of ingredients and to stably be discharged. Such a solvent more preferably has a boiling point of equal to or more than 170° C., and a vapor pressure at room temperature of from 0.10 to 10 mm-Hg.

Any process such as a spin coating process, a dipping process, a casting process and a blade process can be applied to the method for producing a thin film using the composition.

Processes using discharge devices are typically preferred as a process for fine patterning of a functional material for their low costs and simple steps. Among these processes, the ink-jet printing process is specifically preferred.

The target functional film is prepared according to a technique, such as air-drying, heating, pressurization or pressure reduction, gas-flow drying, or combinations of these techniques, during or after the application of the composition onto the substrate.

The above production method can yield a uniform and homogenous functional film without irregular film thickness or phase separation of ingredients. By using procedures to remove the solvent in combination, the target functional film can easily be designed.

The functional element can yield a colored organic EL element when the ink-jet process is employed.

BRIEF DESCRIPTION OF THE DRAWINGS

FIGS. 12(a)–12(c) are perspective views of examples of electronic apparatus using organic EL panels, in which FIG. 12(a) is a perspective view showing an example in which the organic EL panel is applied to a mobile phone; FIG. 12(b) is a perspective view showing an example in which the organic EL panel is applied to an information processing device; and FIG. 12(c) is a perspective view showing an example in which the organic EL panel is applied to wristwatch-type electronic apparatus.

DETAILED DESCRIPTION OF PREFERRED EMBODIMENTS

Figure 1:
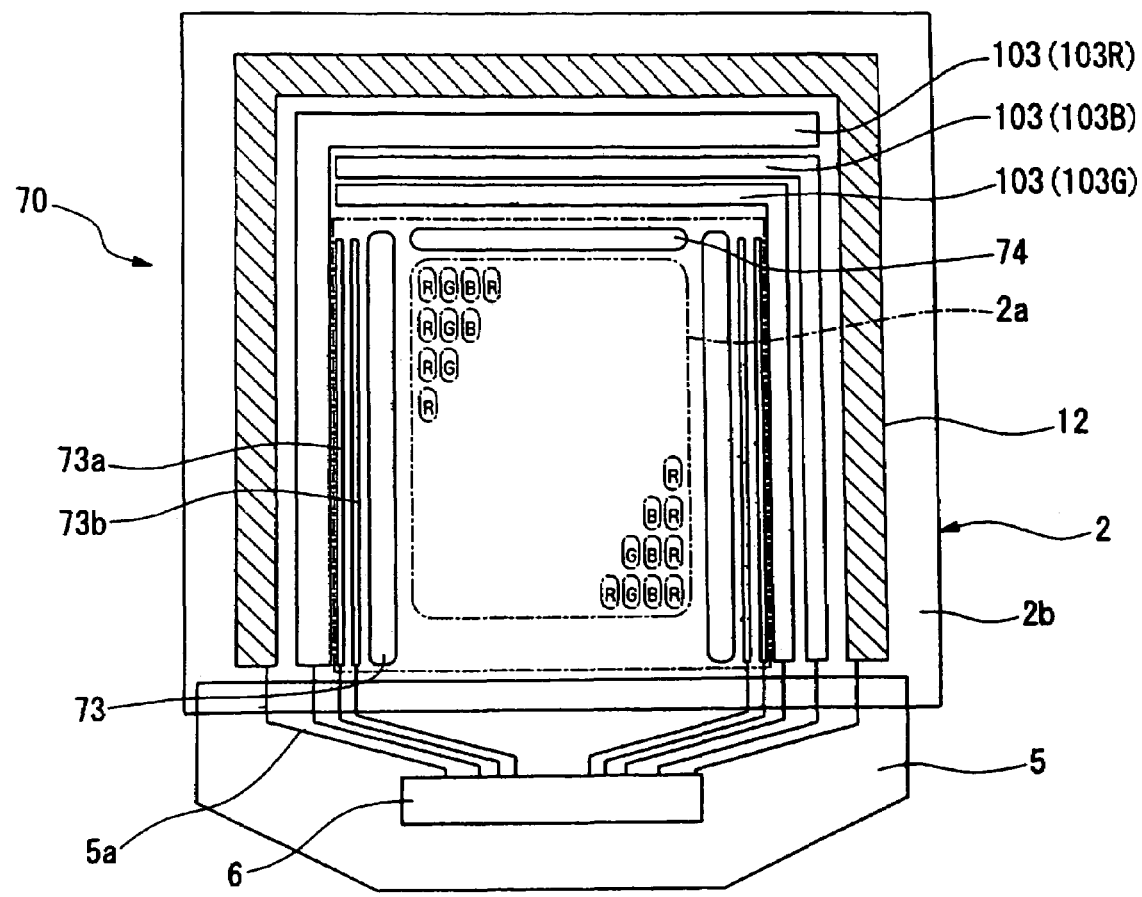
FIG. 1 is a schematic of a planar structure of an example of an organic EL panel as an electro-optical device.

The present invention will be illustrated in further detail with reference to several embodiments below in accordance with exemplary organic EL elements, which are not intended to limit the scope of the invention.

EXAMPLE 1

A composition (G1) (solution) indicated in Table 1 was prepared as a composition for a green light-emitting layer.

A composition (B1) (solution) indicated in Table 2 was prepared as a composition for a blue light-emitting layer.

A composition (R1) (solution) indicated in Table 3 was prepared as a composition for a red light-emitting layer.

TABLE 1

Light-emitting Layer (Green) Composition

| Composition | Material | Compositional Amount |
|---|---|---|
| Light-emitting layer material | Compound 1 | 0.76 g |
| | Compound 2 | 0.20 g |
| | Compound 3 | 0.04 g |
| Solvent | 2,3-Dihydrobenzofuran | 60 ml |
| | Cyclohexylbenzene | 40 ml |

TABLE 2

Light-emitting Layer (Blue) Composition

| Composition | Material | Compositional Amount |
|---|---|---|
| Light-emitting layer material | Compound 1 | 0.78 g |
| | Compound 2 | 0.25 g |
| | Compound 4 | 0.07 g |
| Solvent | 2,3-Dihydrobenzofuran | 60 ml |
| | Cyclohexylbenzene | 40 ml |

TABLE 3

Light-emitting Layer (Red) Composition

| Composition | Material | Compositional Amount |
|---|---|---|
| Light-emitting layer material | Compound 1 | 0.70 g |
| | Compound 2 | 0.20 g |
| | Compound 5 | 0.10 g |
| Solvent | 2,3-Dihydrobenzofuran | 60 ml |
| | Cyclohexylbenzene | 40 ml |

The structures of Compounds 1 through 5 used in the compositions are shown below.

[Chemical Formula 1]

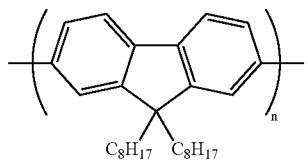

Compound 1

[Chemical Formula 2]

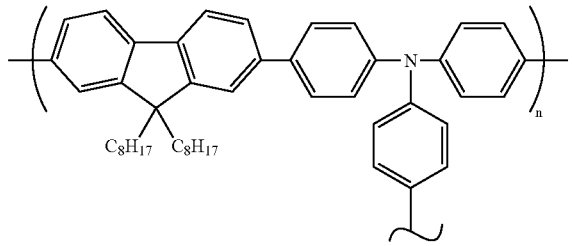

Compound 2

[Chemical Formula 3]

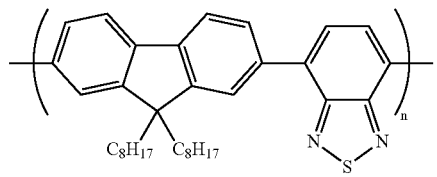

Compound 3

-continued

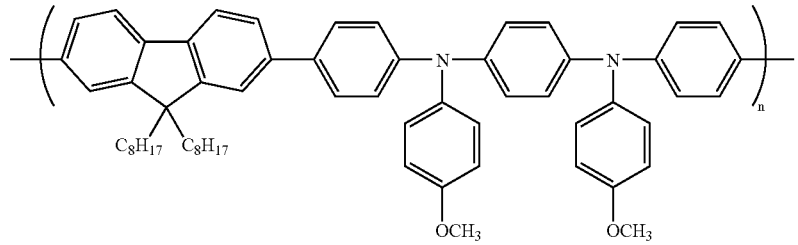

[Chemical Formula 4]

Compound 4

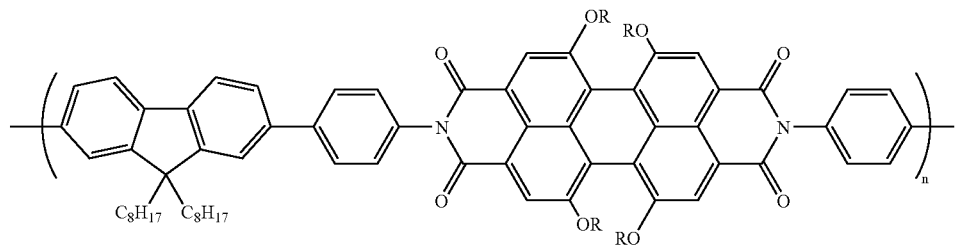

[Chemical Formula 5]

Compound 5

As comparative examples, light-emitting layer compositions (G2), (B2) and (R2) (each a solution) were prepared in the same formulae as in Tables 1 through 3, except that they contain no 2,3-dihydrobenzofuran.

The compositions were stored at room temperature for one month, and then changes in turbidity at 650 nm were checked on the green and blue light-emitting compositions, and changes in turbidity (changes in turbidity with respect to the turbidity of the composition immediately after preparation) at 700 nm were checked on the red light-emitting compositions.

Table 4 shows comparisons of stability of the compositions.

TABLE 4

Stability of Compositions

| Composition | | One week later | One month later |
|---|---|---|---|
| Green light-emitting composition | G1 | Good | Good |
| | G2 | Good | Poor |
| Blue light-emitting composition | B1 | Good | Good |
| | B2 | Good | Poor |
| Red light-emitting composition | R1 | Good | Good |
| | R2 | Good | Poor |

Good: No change in turbidity
Poor: Change in turbidity

Compositions (G2), (B2) and (R2) were very stable within one week after the preparation of the compositions, but showed deposition of ingredients one month later. In contrast, Compositions (G1), (B1) and (R1) were very stable, even one month after the preparation of the compositions.

EXAMPLE 2

A hole injection-transportation composition (solution) having a formula shown in Table 5 below was prepared.

TABLE 5

Hole Injection-transportation Composition

| Composition | Material Name | Content (wt. %) |
|---|---|---|
| Hole injection-transportation material | Baytron P Poly(styrene Sulfonate) | 11.08 1.44 |
| Polar solvent | Isopropyl alcohol N-Methylpyrrolidone 1,3-Dimethyl-imidazolinone | 10 27.48 50 |

The composition (solution) shown in Table 1 was prepared as a green light-emitting layer composition.

Next, a method for producing an organic EL element by the ink-jet process using these materials will be illustrated. In advance of this, a schematic configuration of an example of an organic EL panel will be illustrated as an electro-optical device using the organic EL element as a functional element.

FIG. 1 is a schematic of a planar structure of an example of such an organic EL panel as an electro-optical device, in which the reference numeral 70 is an organic EL panel. The organic EL panel 70 includes a substrate 2, a plurality of organic EL elements and a sealing substrate (not shown). The substrate 2 is made of, for example, glass, and the organic EL elements constitute pixels 71 arrayed in a matrix form.

The substrate 2 includes a transparent substrate, such as glass, and is partitioned into a display area 2a and a non-display area 2b. The display area 2a is at the center of the substrate 2, and the non-display area 2b is on the periphery of the substrate 2 and is arranged outside the display area 2a. The display area 2a is an area formed by the organic EL elements arrayed in a matrix form, and is also referred to as a qualified display area.

A circuit element unit (not shown) is formed between the substrate and an organic EL element unit (not shown) including the organic EL elements and a rib (not shown) and carries, for example, thin film transistors to be scanning lines, signal lines, retention volumes or switching elements.

Cathode wiring 12 is arranged on the periphery of the substrate 2, i.e., in the non-display area 2b. The cathode wiring 12 leads to cathodes (counter electrodes) of the organic EL elements constituting the pixels 71, and is connected to a wiring 5a on a flexible substrate 5 at its edge. The wiring 5a is connected to a driver IC 6 (a driver circuit) formed on the flexible substrate 5.

Power source wires 103 (103R, 103G and 103B) are wired to the circuit element unit in the non-display area 2b.

A pair of scanning driver circuits 73 is arranged at both sides of the display area 2a. These scanning driver circuits 73 are formed in the aforementioned circuit element unit. Driver circuit control signal wiring 73a and driver circuit power source wiring 73b are formed inside of the circuit element unit, and are connected to the scanning driver circuits 73.

An inspection circuit 74 is arranged on one side of the display area 2a. The quality and defects of the resulting display device during production or upon shipping can be checked with the inspection circuit 74.

A sealing unit (not shown) is formed on the organic EL element unit to cover the same. The sealing unit includes a sealing resin applied onto the substrate 2, and a can-sealing substrate (a sealing substrate).

The process for producing organic EL elements as components of such an organic EL panel will be illustrated below, with reference to FIGS. 2 through 11.

Figure 2:
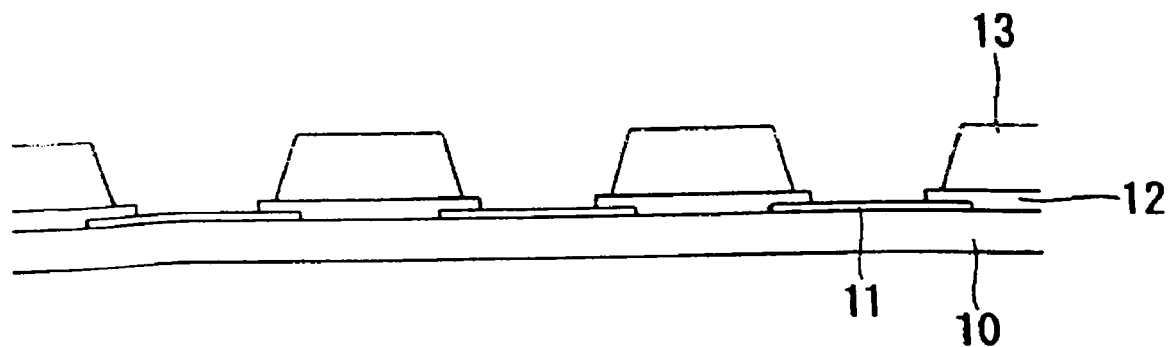
FIG. 2 is a sectional view showing a structure of a substrate used in an example according to the present invention.

Only one pixel is illustrated in this process, but these pixels are arrayed with a pitch of 70.5 μm, as shown in FIG. 2. A multilayer structure including a polyimide film 13 and a SiO2 film 12 is formed on a glass substrate 10 carrying a patterned lithium tin oxide (ITO) 11 by photolithography. The multilayer structure has an opening diameter (opening diameter of the SiO2 layer) of 28 μm and a height of 2 μm. An aperture at the topmost of the polyimide layer is 32 μm. Before the application of the hole injection-transportation composition, the substrate was subjected to plasma treatment at atmospheric pressure, and thereby the polyimide bank became ink-repellent. As the plasma treatment at atmospheric pressure, the substrate was subjected to oxygen plasma treatment at an oxygen gas flow rate of 80 ccm, a helium gas flow rate of 10 SLM and a table transfer speed of 5 mm/s, and was then subjected to CF4 plasma treatment at a CF4 gas flow rate of 100 ccm, a helium gas flow rate of 10 SLM and a table transfer speed of 3 mm/s. Both treatments were performed at atmospheric pressure at a power of 300 W, and a distance between the electrode and the substrate of 1 mm.

Figure 3:
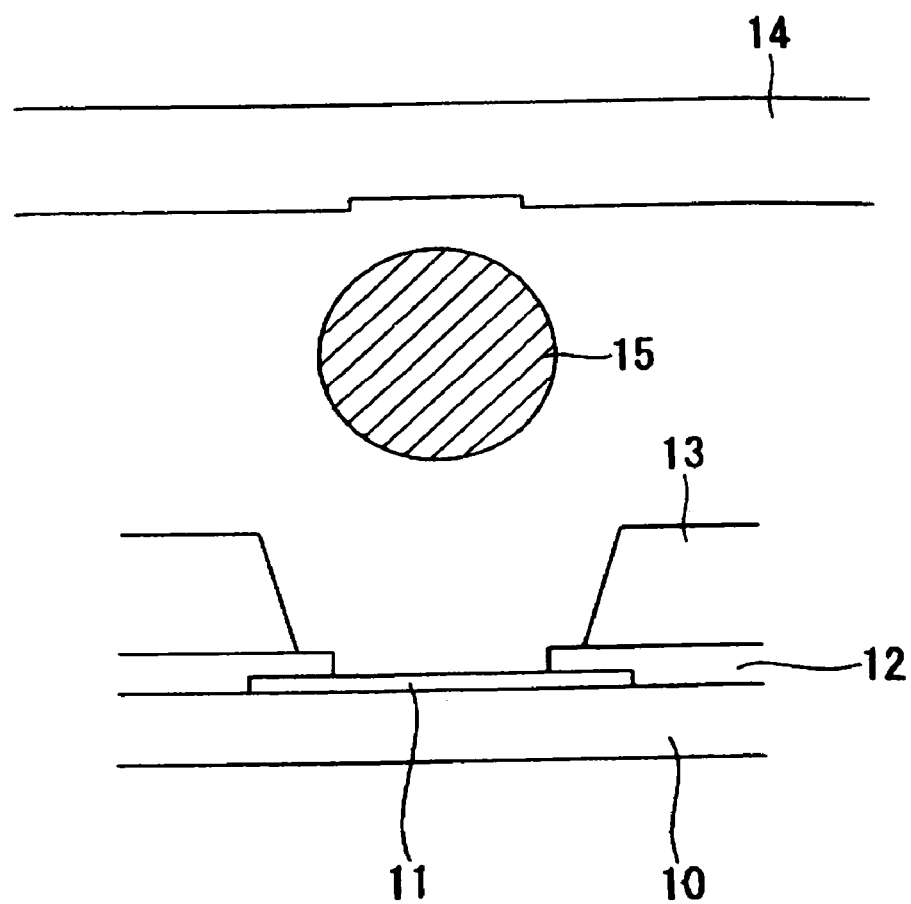
FIG. 3 is a sectional view showing a step of a method for producing an organic EL element of the example according to the present invention.
Figure 4:
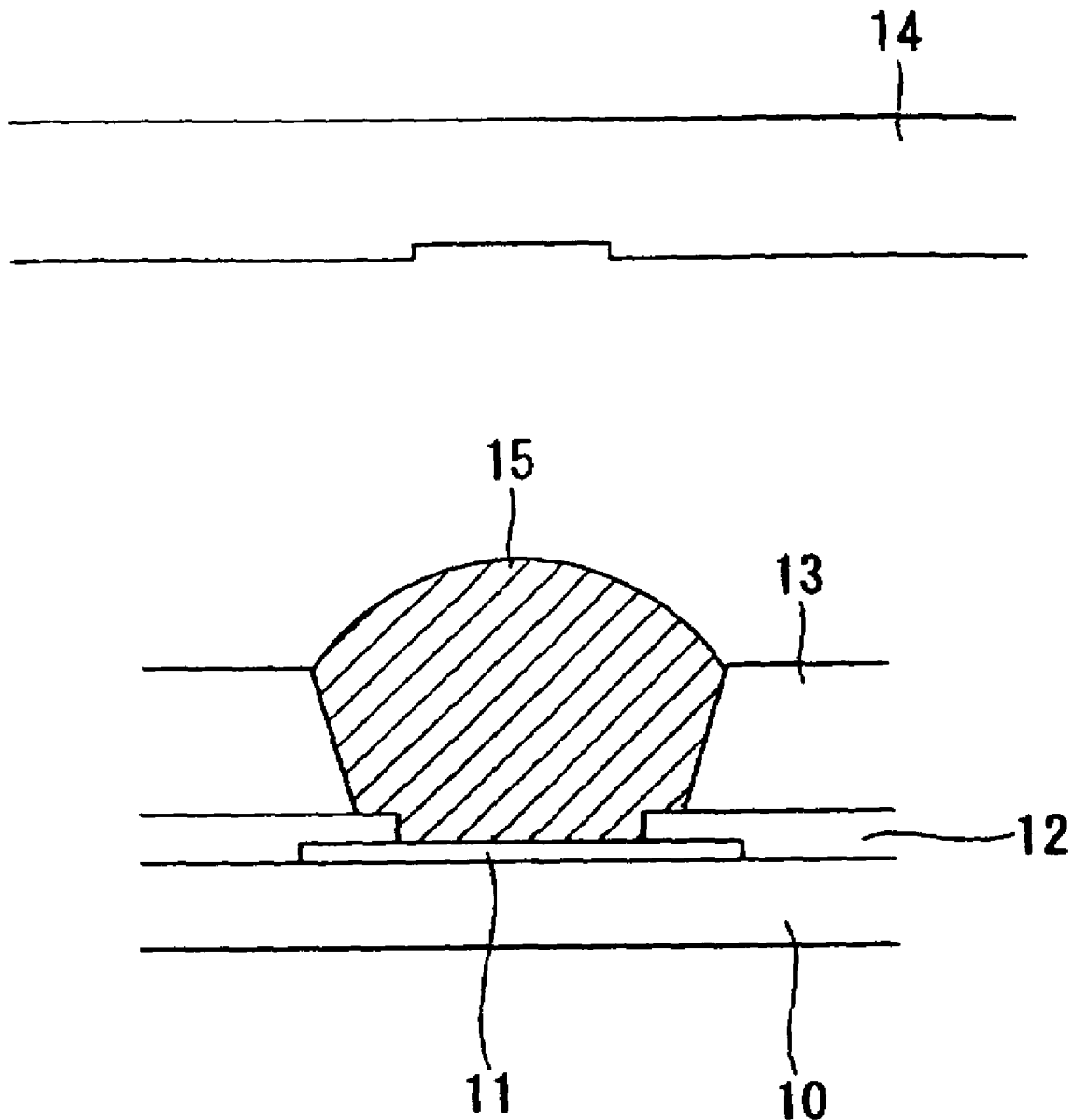
FIG. 4 is a sectional view showing another step of the method for producing an organic EL element of the example according to the present invention.
Figure 5:
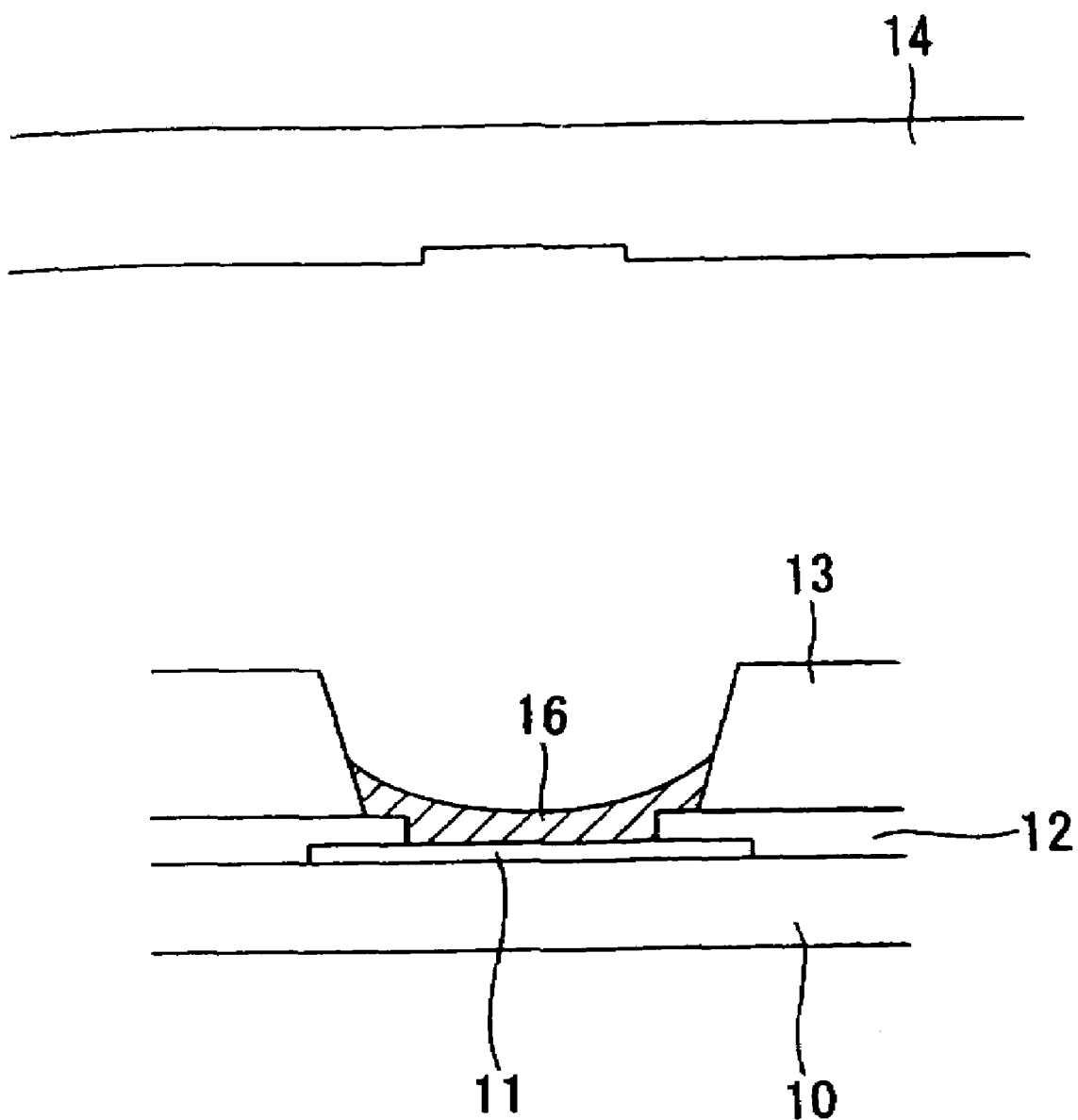
FIG. 5 is a sectional view showing another step of the method for producing an organic EL element of the example according to the present invention.

With reference to FIGS. 3 through 5, after the surface treatment of the substrate, 15 pl of the hole injection-transportation composition (solution) 15 having the formula indicated in Table 5 was discharged from an ink-jet printing device head 14 to apply the same as a pattern. The solvent was then removed at room temperature in a vacuum (1 torr) for 20 minutes, followed by heat treatment at 200° C. (on a hot plate) in the air for 10 minutes to thereby yield a hole injection-transportation layer 16.

Figure 6:
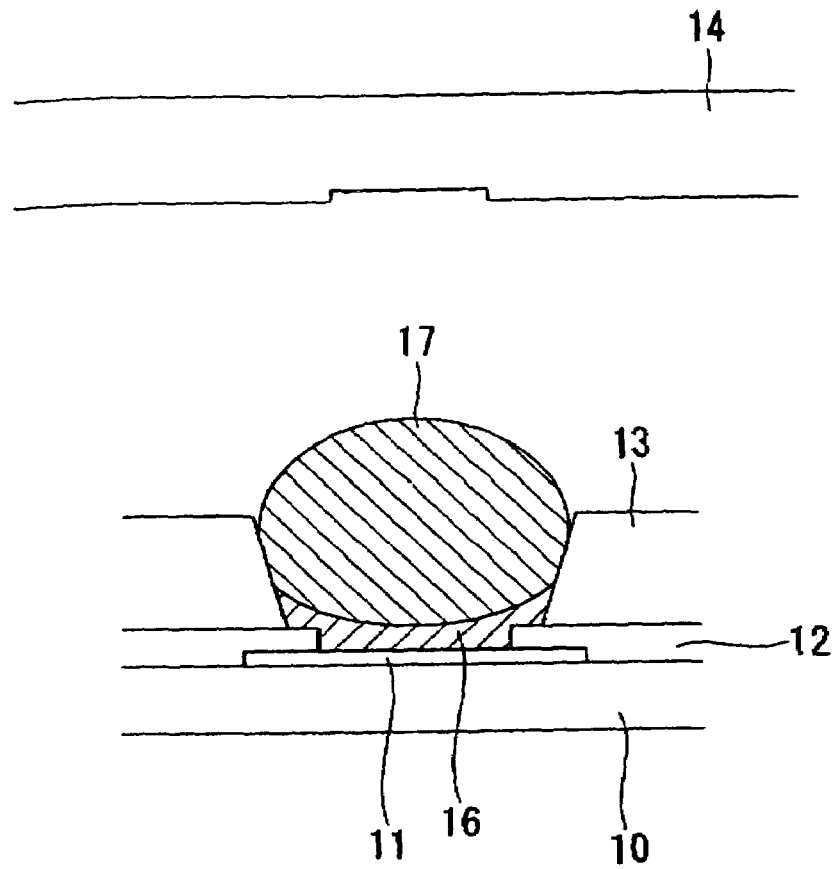
FIG. 6 is a sectional view showing another step of the method for producing an organic EL element of the example according to the present invention.
Figure 7:
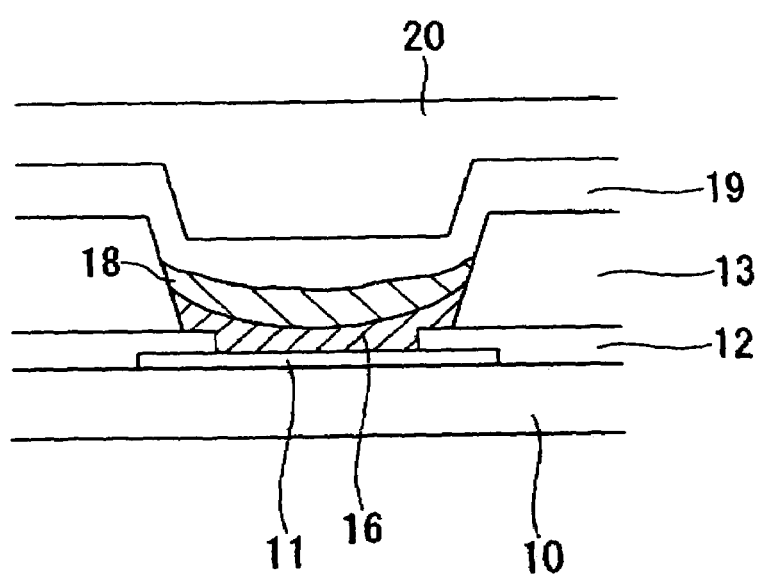
FIG. 7 is a sectional view showing another step of the method for producing an organic EL element of the example according to the present invention.

Next, 20 pl of a green light-emitting layer composition 17 indicated in Table 1 was discharged from the ink-jet printing device head 14 to be applied on the substrate as a pattern, as shown in FIGS. 6 and 7. Subsequently, the substrate was heated at 60° C. on a hot plate to remove the solvent, and thereby yielded a green light-emitting layer 18.

Cathodes were formed by vapor deposition. The resulting article was ultimately sealed with an epoxy resin, and thereby yielded an element (1).

An element (2) was prepared in the same manner as above, except that a light-emitting layer composition having the same formula shown in Table 1 except for containing no 2,3-dihydrobenzofuran was prepared and was used.

Figure 8:
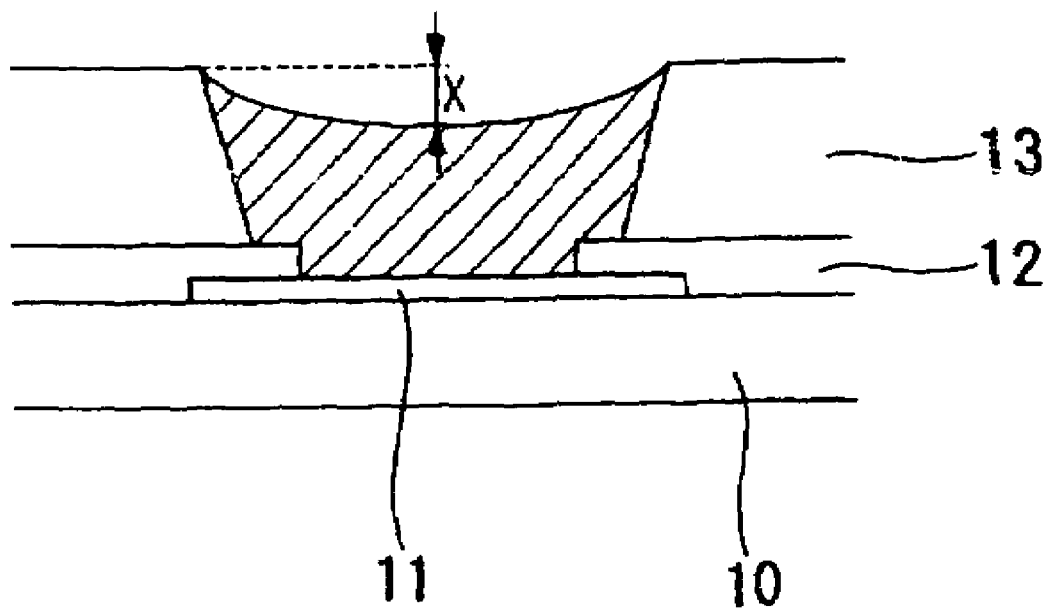
FIG. 8 is a sectional view schematically showing a cross-section of a light-emitting layer of an organic EL element obtained in the example according to the present invention.
Figure 9:
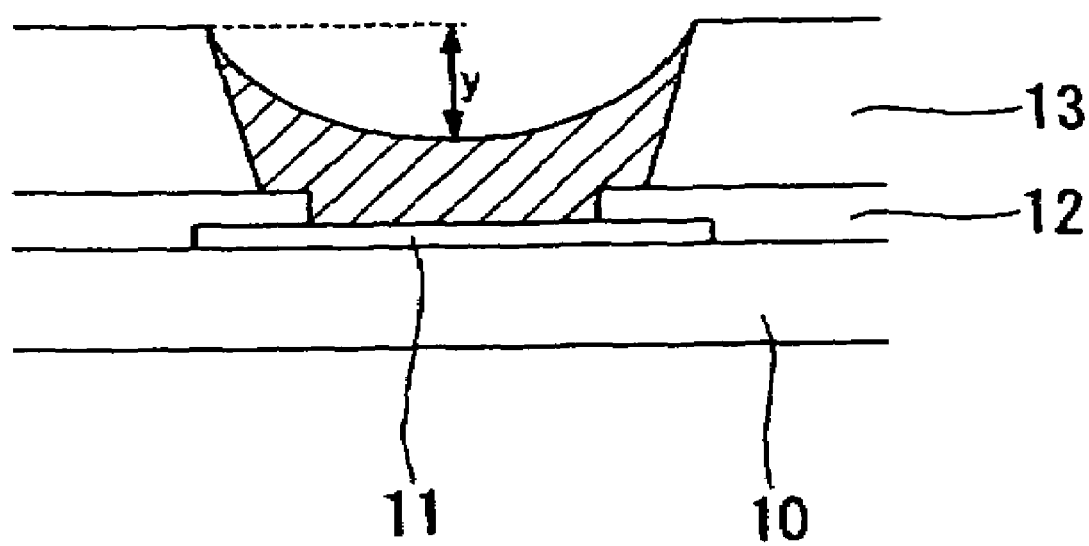
FIG. 9 is a sectional view schematically showing a cross-section of a light-emitting layer of an organic EL element obtained as a comparative example with respect to the example according to the present invention.

FIGS. 8 and 9 are sectional views of the organic EL thin films.

The film thicknesses of the prepared thin films at the center and at the edge were measured with a contact film-thicknessmeter. When the difference in film thickness between the center and the edge in the element (1) is defined as x (FIG. 8) and that in the element (2) is defined as y (FIG. 9), the relationship between x and y is:

$$x<y,$$

indicating that the formed film in the element (1) could have a very uniform film thickness.

Figure 10:
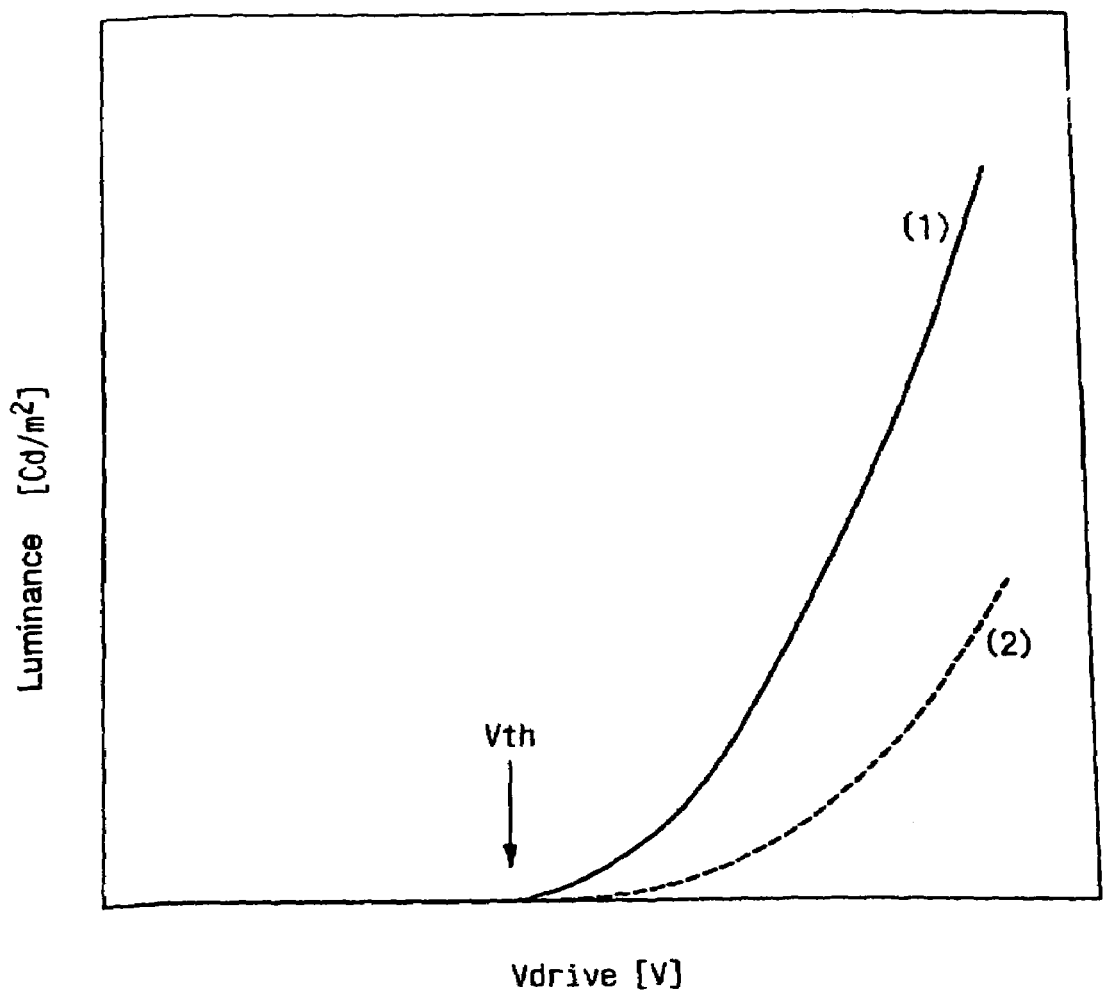
FIG. 10 is a graph showing voltage-luminance characteristics of the organic EL elements obtained as a comparative example and the example according to the present invention.

FIG. 10 is a graph that shows comparisons in voltage-luminance characteristic between the elements (1) and (2).

The element (1) showed higher luminance and more uniform light emission than the element (2) at the same voltage, indicating that the element (1) has satisfactory light emitting characteristics.

EXAMPLE 3

A substrate having a multilayer structure including an ITO electrode, a SiO film and a polyimide film, each having a predetermined shape of an opening, was prepared, and a hole injection-transportation layer was applied thereto in the same manner as in Example 2. Next, a green light-emitting layer composition (having the formula shown in Table 1) was then applied onto the substrate, and immediately after the application, the substrate was heated at 60° C., while the solvent under a reduced pressure (2 mm-Hg) was removed, and thereby a green light-emitting layer was yielded. Subsequently, an element (3) was prepared under the same conditions as in Example 2, except for the drying condition, and the voltage-luminance characteristic of the element (3) was measured. The same result as in Example 2 was obtained.

EXAMPLE 4

A substrate having a multilayer structure including an ITO electrode, a SiO film and a polyimide film, each having a predetermined shape of an opening, was prepared, and a hole injection-transportation layer (having the formula shown in Table 5) was applied thereto in the same manner as in Example 2. Subsequently, 15 pl of a blue light-emitting layer composition having the formula shown in Table 2 was discharged from a head of an ink-jet printing device and was applied onto the substrate as a pattern. Next, the substrate was heated at 60° C. on a hot plate to remove the solvent, and thereby yielded a blue light-emitting layer.

Next, cathodes were formed and sealing was performed in the same manner and condition as in Example 2, and thereby yielded an element (4).

As a comparative example, an element (5) was prepared under the same condition as above, except that a light-emitting layer composition having the same formula shown in Table 2, except for containing no 2,3-dihydrobenzofuran, was prepared and was used.

The voltage-luminance characteristics of the elements (4) and (5) were compared, and the element (4) using a composition containing 2,3-dihydrobenzofuran showed more uniform and higher luminance, as in Example 2.

Figure 11:
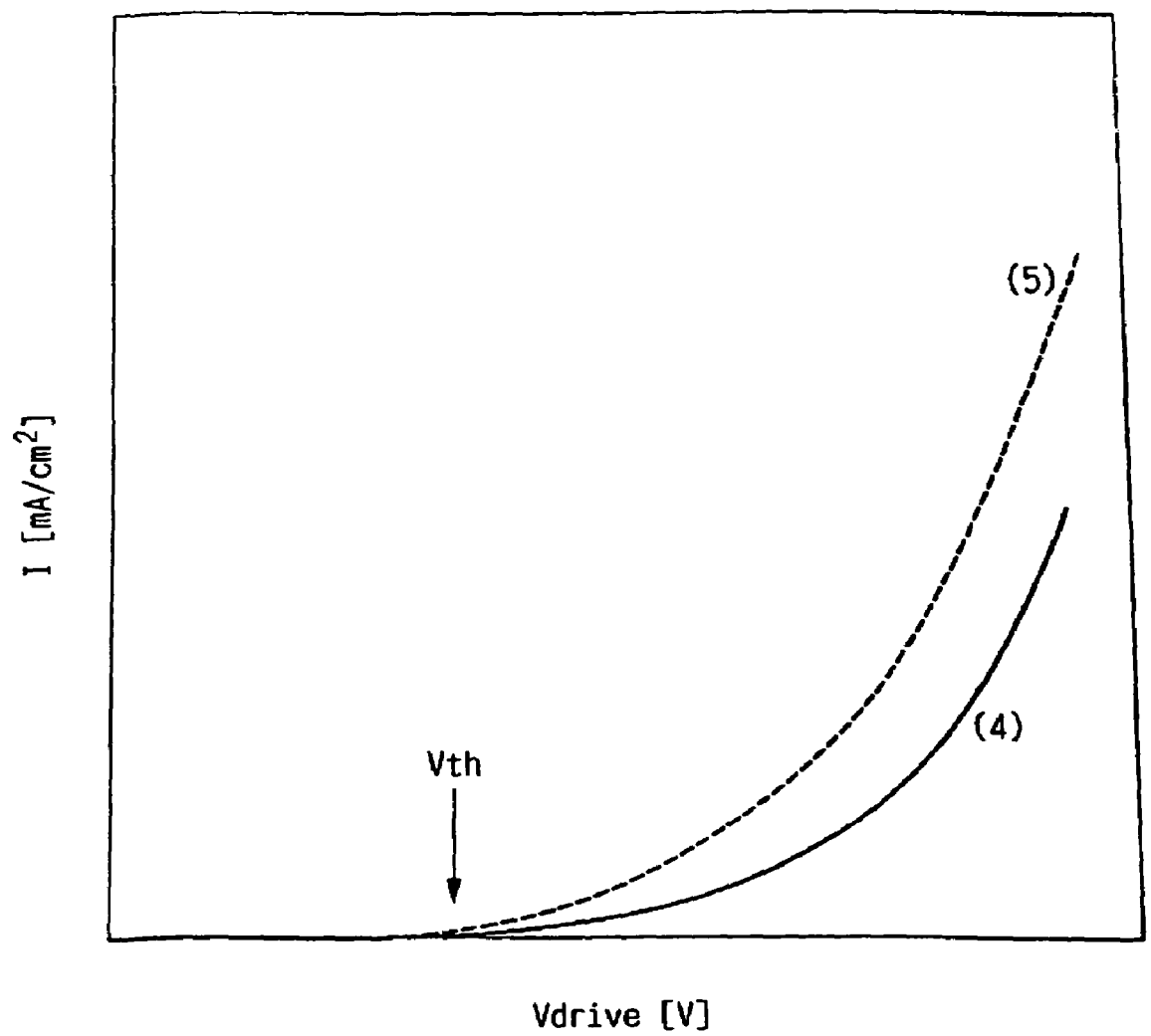
FIG. 11 is a graph showing voltage-current characteristics of the organic EL elements obtained as a comparative example and the example according to the present invention.

FIG. 11 is a graph that shows a comparison in voltage-current characteristic between the element (4) and the element (5).

The element (4) exhibited a lower amount of current than the element (5), and was an excellent element with high efficiency.

EXAMPLE 5

A substrate having a multilayer structure including an ITO electrode, a SiO2 film and a polyimide film, each having a predetermined shape of an opening, was prepared, and a hole injection-transportation layer (having the formula shown in Table 5) was applied thereto in the same manner as in Example 2. Subsequently, 15 pl of a blue light-emitting layer composition having the formula shown in Table 2 was discharged from a head of an ink-jet printing device, and was applied onto the substrate as a pattern. Next, the substrate was heated at 60° C. on a hot plate to remove the solvent, and thereby yielded a red light-emitting layer.

Next, cathodes were formed and sealing was performed in the same manner and condition as in Example 2, and thereby yielded an element (6).

As a comparative example, an element (7) was prepared under the same condition as above, except that a light-emitting layer composition having the same formula shown in Table 3, except that it contained no 2,3-dihydrobenzofuran, was prepared and was used.

The voltage-luminance characteristics of the elements (6) and (7) were compared, and the element (6) using a composition containing 2,3-dihydrobenzofuran showed more uniform and higher luminance, as in Examples 2 and 4.

By separately patterning each of the three compositions shown in the examples according to the ink-jet process, a high-luminance color organic EL element can be prepared. In addition, by using the organic EL layer formed with the use of the compositions, a color organic EL display device having excellent luminance can be produced.

Next, electronic apparatus according to the present invention will be illustrated. The electronic apparatus of the present invention use the organic EL panel (the color organic EL display device) as a display.

FIG. 12(a) is a perspective view showing an example of mobile phones. In FIG. 12(a), a main body 500 of the mobile phone includes a display device (a display) 501 including the organic EL panel.

FIG. 12(b) is a perspective view showing an example of portable information processing devices, such as word processors and personal computers. In FIG. 12(b), an information processing device 600 includes an input unit 601, such as a key board, an information processing main body 603, and a display device (a display) 602 including the organic EL panel.

FIG. 12(c) is a perspective view showing an example of wristwatch-type electronic apparatus. In FIG. 12(c), a watch main body 700 includes a display device (a display) 701 including the organic EL panel.

The electronic apparatus shown in FIGS. 12(a) to 12(c) use the organic EL panel as a display device (display), and are satisfactory apparatus including the organic EL element (functional element) including a uniform and homogenous thin film.

As is described above, the compositions provided by the present invention can prevent or reduce clogging on discharge or curving of the discharged compositions, and can stably be discharged upon the application of the compositions by the ink-jet process. In addition, the methods for producing a film provided by the present invention can form a uniform and homogenous thin film using the compositions, and can produce functional elements, especially organic EL elements, as well as organic EL display devices and other electro-optical devices and various types of electronic apparatus.

What is claimed is:

1. A method for forming a film on a substrate, comprising:
   discharging a liquid material using an inkjet discharge device to the substrate to form a film on the substrate, the liquid material including a solvent and a solute, the solvent including a heterocyclic compound, the heterocyclic compound having a furan skeleton, a boiling point of the heterocyclic compound being greater than 170° C., and the solvent including a benzene derivative.

2. The method according to claim 1, wherein the heterocyclic compound is benzofuran or 2,3-dihydrobenzofuran.

3. A method of forming a film on a substrate, comprising:
   discharging a liquid material using an inkjet discharge device to the substrate to form a film on the substrate, the liquid material including a solvent and a solute, the solvent including a heterocyclic compound, the heterocyclic compound having a furan skeleton, and a boiling point of the heterocyclic compound being greater than 170 degrees centigrade.

4. The method according to claim 3, the heterocyclic compound including 2,3-dihydrobeuzofuran.

5. The method according to claim 3, the solvent including a benzene derivative.

6. The method according to claim 3, a vapor pressure of the solvent at room temperature being less than 10 mmHg and greater than 0.10 mmHg.

7. The method according to claim 3, the solute including a semiconductor material.

8. The method according to claim 3, the solute including a conductive material.

9. The method according to claim 3, Wherein the heterocyclic compound is benzofuran or 2,3-dihydrobenzofuran.

* * * * *